United States Patent
Hao et al.

(10) Patent No.: US 9,745,477 B2
(45) Date of Patent: Aug. 29, 2017

(54) METHOD FOR UNIFORM DISPERSION OF SINGLE-WALL CARBON NANOTUBES

(71) Applicants: BEIJING AGLAIA TECHNOLOGY DEVELOPMENT CO., LTD., Beijing (CN); GUANGDONG AGLAIA OPTOELECTRONIC MATERIALS CO., LTD., Foshan, Guangdong (CN)

(72) Inventors: Haiyan Hao, Foshan (CN); Xiliang Cao, Foshan (CN); Lei Dai, Beijing (CN); Lifei Cai, Beijing (CN)

(73) Assignees: BEIJING AGLAIA TECHNOLOGY DEVELOPMENT CO., LTD., Beijing (CN); GUANGDONG AGLAIA OPTOELECTRONIC MATERIALS CO., LTD., Foshan (CN)

( * ) Notice: Subject to any disclaimer, the term of this patent is extended or adjusted under 35 U.S.C. 154(b) by 0 days.

(21) Appl. No.: 15/106,733

(22) PCT Filed: Nov. 28, 2014

(86) PCT No.: PCT/CN2014/092467
§ 371 (c)(1),
(2) Date: Jun. 20, 2016

(87) PCT Pub. No.: WO2015/096592
PCT Pub. Date: Jul. 2, 2015

(65) Prior Publication Data
US 2017/0029634 A1    Feb. 2, 2017

(30) Foreign Application Priority Data
Dec. 23, 2013 (CN) .......................... 2013 1 0717024

(51) Int. Cl.
*H01B 1/04* (2006.01)
*C09D 5/24* (2006.01)
(Continued)

(52) U.S. Cl.
CPC .............. *C09D 5/24* (2013.01); *C01B 31/026* (2013.01); *C01B 31/0273* (2013.01); *H01B 1/04* (2013.01);
(Continued)

(58) Field of Classification Search
CPC ..... C09D 5/24; C01B 31/0273; C01B 31/026; C01B 2202/02; H01B 1/04;
(Continued)

(56) References Cited

U.S. PATENT DOCUMENTS

| 7,535,462 B2* | 5/2009 | Spath .................... G06F 3/045 345/174 |
| 2004/0038251 A1* | 2/2004 | Smalley ................ B82Y 15/00 435/6.11 |

(Continued)

FOREIGN PATENT DOCUMENTS

| CN | 101941690 A | 1/2011 |
| CN | 102424379 A | 4/2012 |
| TW | 201026603 A1 | 7/2010 |

*Primary Examiner* — Mark Kopec
*Assistant Examiner* — Jaison Thomas
(74) *Attorney, Agent, or Firm* — Maschoff Brennan

(57) ABSTRACT

Provided is a method for uniform dispersion of single-wall carbon nanotubes, comprising: (1) dispersing single-wall carbon nanotube powder in a low-boiling point alcohol or water or DMF, then placing into a UV bench for ultraviolet irradiation and oxidation; (2) after cleaning the carbon nanotubes in the UV bench, using a strong acid to carry out an oxidation reaction, then washing by centrifugation; (3) after cleaning with strong acid, subjecting the single-wall carbon nanotubes to ethanol or water ultrasonic dispersion 2-3 times, washing by centrifugation, then dissolving in low-boiling point alcohol or water or DMF solution to obtain a single-wall carbon nanotube dispersion. By means of the present method, the entire surface of a carbon nanotube is grafted with a functionalized group, achieving solu- (Continued)

bility of single-wall carbon nanotubes; further, high-performance carbon nanotube composite flexible transparent electrode materials can be prepared, which have high transmittance and low sheet resistance.

9 Claims, 1 Drawing Sheet

(51) Int. Cl.
    *C01B 31/02*     (2006.01)
    *H01L 51/44*     (2006.01)
    *B82Y 40/00*     (2011.01)
    *B82Y 30/00*     (2011.01)

(52) U.S. Cl.
    CPC .......... *H01L 51/444* (2013.01); *B82Y 30/00* (2013.01); *B82Y 40/00* (2013.01); *C01B 2202/02* (2013.01); *Y02E 10/549* (2013.01); *Y10S 977/75* (2013.01); *Y10S 977/845* (2013.01); *Y10S 977/932* (2013.01)

(58) Field of Classification Search
    CPC .............. Y10S 977/932; Y10S 977/75; Y10S 977/845; B82Y 40/00; B82Y 30/00; H01L 51/444; Y02E 10/549
    See application file for complete search history.

(56) References Cited

U.S. PATENT DOCUMENTS

| | | | |
|---|---|---|---|
| 2005/0234263 A1* | 10/2005 | Prato | B82Y 30/00 562/440 |
| 2006/0014375 A1* | 1/2006 | Ford | B82Y 30/00 438/622 |
| 2006/0188723 A1* | 8/2006 | Rowley | B82Y 10/00 428/408 |
| 2007/0292622 A1* | 12/2007 | Rowley | B82Y 10/00 427/407.1 |
| 2008/0152573 A1* | 6/2008 | Juni | B01J 19/123 423/447.1 |
| 2009/0061194 A1* | 3/2009 | Green | B82Y 10/00 428/220 |
| 2010/0172818 A1* | 7/2010 | Lin | B82Y 30/00 423/460 |
| 2011/0048277 A1* | 3/2011 | Sivarajan | C09D 11/52 106/31.13 |
| 2011/0204281 A1* | 8/2011 | Rouse | B82Y 30/00 252/75 |
| 2013/0214210 A1* | 8/2013 | Hondo | C01B 31/02 252/502 |

\* cited by examiner

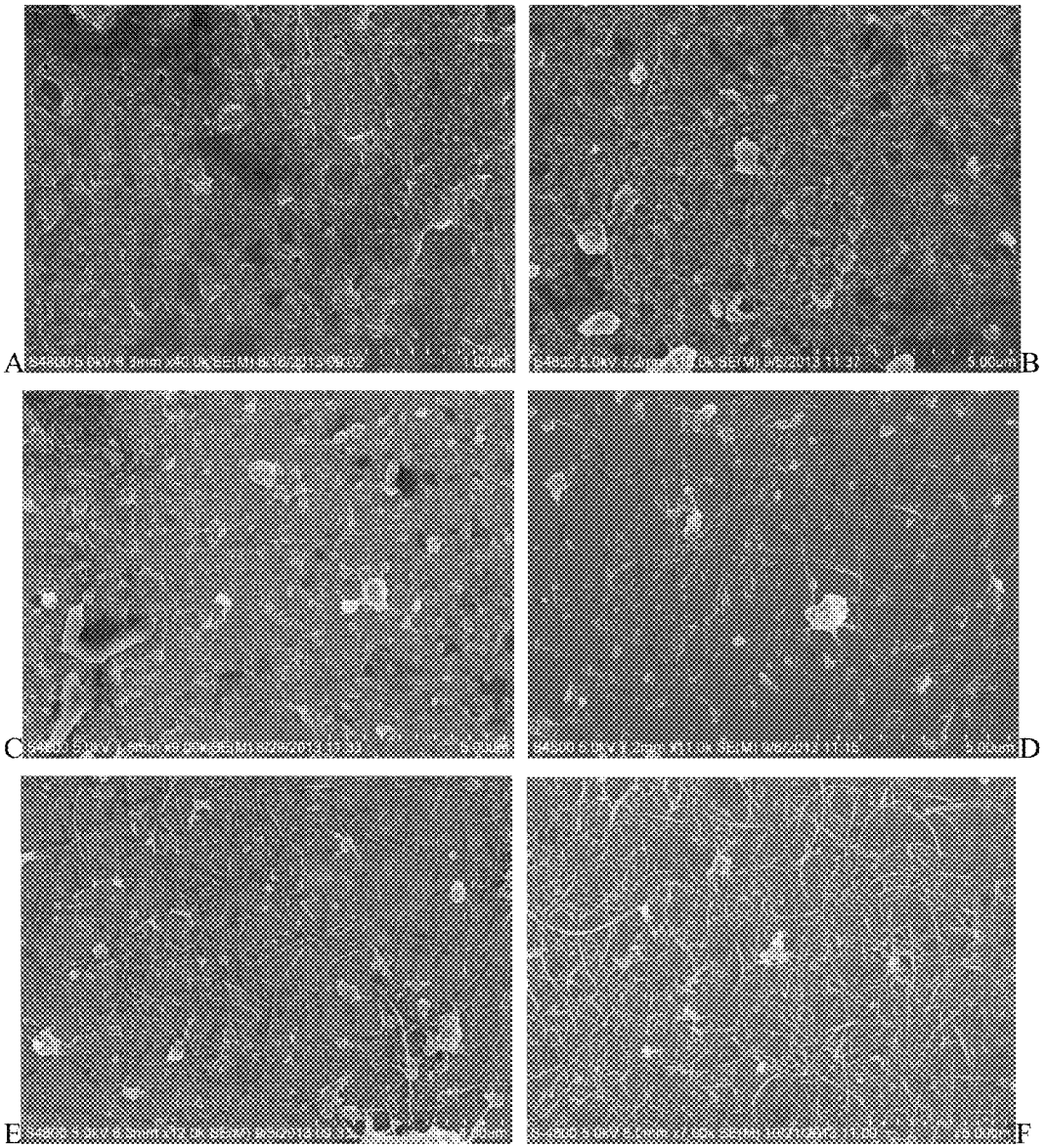

METHOD FOR UNIFORM DISPERSION OF SINGLE-WALL CARBON NANOTUBES

TECHNICAL FIELD

The invention relates to a processing method of carbon nanotube, in particular, to a method for uniform dispersion of single-wall carbon nanotubes.

BACKGROUND ART

The carbon nanotube is a carbon material with the feature of typical layered hollow structure, and the body of carbon nanotube is composed of a structural unit of hexagonal graphite carbon ring, which is a one-dimensional quantum material with special structure (nanometer scale in radial dimension, and micron dimension in axial dimension). Its tube wall is mainly composed of several layers to tens of layers of coaxial circular tubes, and there is a fixed distance of about 0.34 nm between layers; generally, its diameter is 2~20 nm. Its conjugative effect is obvious since P electron on the carbon atom on the carbon nanotube forms a wide range of delocalized π bond; and it has excellent electrical properties for the structure of carbon nanotube is the same as the lamellar structure of graphite. The single-wall carbon nanotube material is regarded as a transparent electrode that can replace ITO especially by the research community and the industrial circle due to its high electronic mobility and low electrical resistivity. However, the strong van der waals force (~500 eV/μm) and great slenderness ratio (>1000) between single-wall carbon nanotubes is usually easy to form a big tube bundle, which is hard to disperse, so its excellent performance and practical use are restricted greatly.

At present, main dispersion methods of carbon nanotube in solvents are non-covalent functionalization, covalent functionalization and solvent stripping. The common character of these methods is that they all need the aid of a greater mechanical force. For example: use high frequency ultrasound, ball milling, etc. to promote the dispersion of carbon nanotube, then remove big tube bundles by high speed centrifugal separation. But large mechanical forces will damage carbon nanotubes inevitably, so separation of big tube bundles by high speed centrifugation will cause loss of carbon nanotubes. Additionally, the use of non-covalent functionalization may introduce additives that help disperse carbon nanotubes such as surfactants or polymers etc. which are difficult to remove completely, thus reducing the electrical and thermodynamic properties of the carbon nanotube network itself; the use of covalent functionalization will damage the sp2 structure of functional site of carbon nanotube; and for solvent stripping, the used solvents usually have a high boiling point, high toxicity and low dispersion efficiency. Therefore, while maintaining the structural integrity of carbon nanotube and without adding any additive, effective dispersion of carbon nanotubes in common solvents is still an important issue in the research and application of single-wall carbon nanotube.

The conductivity of single-wall carbon nanotube is the highest among carbon nanotubes. But, the single-wall carbon nanotube is the most difficult one to be dispersed in solvents. Water or alcohol with low boiling point (such as methanol, 2-propanol) is usually used as the dispersion solvent. However, such solvents are poor to wet and disperse single-wall carbon nanotubes. Comparing with such solvents, organic solvents such as tetrahydrofuran, dimethylformamide are slightly better in dispersibility. But, the toxicity of tetrahydrofuran is high, and the boiling point of dimethylformamide is too high. Therefore, the concentration of the dispersion liquid of carbon nanotube prepared by the method for dispersing single-wall carbon nanotubes by a single solvent is very low.

Additionally, surfactants such as sodium dodecyl benzene sulfonate, octyl phenol macrogol ester, polyvinyl pyrrolidone are added in water or alcohols solvent to help disperse the single-wall carbon nanotube. But the amount of the used surfactants is large, some reach above 10% in concentration, while the concentration of single-wall carbon nanotubes that can be dispersed is still low. So the conductivity and the heat transfer property of single-wall carbon nanotube films are poor due to the influence of large amount of surfactants in the dispersion liquid.

SUMMARY OF THE INVENTION

Specific to the drawbacks in the above described fields, the invention provides a method for uniform dispersion of single-wall carbon nanotubes, with no need to dispersing aids. Under the premise of the structural integrity of single-wall carbon nanotube, it can achieve the uniform dispersion of single-wall carbon nanotube in water or alcohols solvent. And ethanol dispersion liquid of this single-wall carbon nanotube is used as raw material to develop carbon nanotube composite transparency electrode film material on the surface of PET films.

A method for uniform dispersion of single-wall carbon nanotubes, comprising the following steps:

(1) Dispersing single-wall carbon nanotube powder in a low-boiling point alcohol or water or DMF, then placing into a UV bench for ultraviolet irradiation and oxidation;

(2) After cleaning the carbon nanotubes in the UV bench, using a strong acid to carry out an oxidation reaction, then washing by centrifugation.

(3) After cleaning with strong acid, subjecting the single-wall carbon nanotubes to ethanol or water ultrasonic dispersion 2-3 times, washing by centrifugation, then dissolving in low-boiling point alcohol or water or DNIF solution to obtain a single-wall carbon nanotube dispersion. The irradiation power of the UV bench is 250 W-500 W, and the irradiation must last for 30-60 minutes.

The oxidation reaction is performed in the presence of strong oxidizing acid or mixture of strong acid and oxidizing agent.

The strong oxidizing acid is one or more of concentrated nitric acid, concentrated sulfuric acid or trifluoroacetic acid (TFA), the mixture of strong acid and oxidizing agent is concentrated nitric acid or concentrated sulfuric acid with peroxide.

The peroxide is hydrogen peroxide or ammonium peroxide.

When the strong oxidizing acid is concentrated nitric acid or concentrated sulfuric acid or the mixture of strong acid and oxidizing agent is concentrated nitric acid or concentrated sulfuric acid with peroxide, the reaction should be performed for 0.5-5 h at 80-120° C.; or when the strong oxidizing acid is TFA, ultrasonic dispersion should be performed for 30-120 minutes at normal temperature, and perform centrifugal washing, then perform oxidation at normal temperature repeatedly for 2-5 times.

Repeat Step (1) or/and Step (2) once or twice.

The dispersion in Step (1) is dispersion through ultrasonic wave or cell crusher.

The alcohol with low boiling point is methanol or ethanol.

The invention combines with the technique of oxidation of UV bench and the wet chemical technique to realize washing of single-wall carbon nanotube powder, reducing or removing the impurities adhered to the surface of single-wall carbon nanotube, and making functional groups be grafted on the surface of single-wall carbon nanotube, thus achieve the dispersion of single-wall carbon nanotube in polar solvent.

The principle of the invention is based on carbonaceous byproducts and metal catalysts such as amorphous carbon, carbonaceous nano-particles and carbon fragments with high chemical activity and low crystallinity are usually contained on the surface single-wall carbon nanotube or among single-wall carbon nanotubes. Selective functionalization of surface of single-wall carbon nanotube can be achieved through control of the irradiation power and time of ultraviolet light and control of the oxidation condition of wet chemistry, thus achieving uniform dispersion of single-wall carbon nanotube in solvents while not influencing the structure and performance of carbon nanotube basically.

The related process technique in the invention is to use a UV bench to oxidize and decompose the small molecules adhered to the surface of single-wall carbon nanotube and easily decomposed organize substances first or change their forms on the surface of single-wall carbon nanotube, then make the carbon nanotube functional through control of strong acidic materials, so as to make the carbonaceous byproducts with higher activity adhered to the surface of carbon nanotube carboxylic, and then to make functional groups be grafted on the surface of the complete carbon nanotube, thus realizing the solubility of single-wall carbon nanotube while maintaining its structural integrity and electrical properties.

Specific techniques are as follows:

Step 1: Disperse single-wall carbon nanotube powder in alcohols with low boiling point or water solution, and use ultrasonic wave or a cell crusher to disperse. After filtration, put the dispersion liquid in a UV bench for irradiation for a certain time. The power of the UV bench is controlled at 250 W-500 W, and the irradiation time is controlled at 10-60 min.

Step 2: Control the reaction condition of carbon nanotube with strong acid after irradiation and washing by the UV bench, and then wash it.

Step 3: Perform centrifugal separation for several times after the single-wall carbon nanotube is washed with strong acid, and repeat ultrasonic washing, to obtain the uniform dispersion liquid of single-wall carbon nanotube.

The processing steps in the technique require repetition and adjustment for several times, particularly in Step 2, different strong acids have different action on amorphous carbon; and there will also be great differences in the solubility of the resulting single-wall carbon nanotube and the cleanliness of the carbon nanotube. Strong acids used in the invention are trifluoroacetic acid (TFA), nitric acid, concentrated sulfuric acid, and hydrogen peroxide which are easy to dissolve and will not leave inorganic salt on the surface carbon nanotube; and the corresponding solvents are methanol, ethanol, water, and N,N-dimethylformamide (DMF).

The treatment process is different for different acids, wherein the mixed acid of DMF and TFA is treated at normal temperature for 40-120 min, and other acids or mixed acids are treated at 80-120° C. for 30-300 min.

Based on the application for the development of carbon nano composite transparent electrode material, the invention achieves the uniform dispersion of single-wall carbon nanotube in water or alcohols solvent under the premise of the structural integrity of single-wall carbon nanotube with no need to dispersing aids. The absorbance value of dispersion liquid of carbon nanotube is used to represent the concentration of carbon nanotube. Generally, the absorbance value of carbon nanotube with poor dispersion is about 16000-17000; while the absorbance value of dispersion liquid of carbon nanotube designed in the invention can be reduced by 10 times, which is about 1500. And ethanol dispersion liquid of this single-wall carbon nanotube is used as raw material to develop carbon nanotube composite transparent electrode film material on the surface of PET film.

Add the dispersion liquid of single-wall carbon nanotube with good dispersibility prepared in the invention to the conductive polymer system as a conductive material, and under the condition of no surfactant being added, to prepare the high-performance carbon nano composite flexible electrode material, with high transmittance and low sheet resistance.

The dispersion liquid of single-wall carbon nanotube with good dispersibility prepared in the invention can be taken as the carrier of nano-catalyst or other functional nano materials, to achieve its application in special environment.

BRIEF DESCRIPTION OF THE DRAWINGS

FIG. 1 is pictures of SEM of single-wall carbon nanotube. Where: A is a single-wall carbon nanotube before treatment, B is a single-wall carbon nanotube after treatment according to embodiment 1, C is a single-wall carbon nanotube after treatment according to embodiment 2, D is a single-wall carbon nanotube after treatment according to embodiment 3, E is a single-wall carbon nanotube after treatment according to embodiment 4, and F is a single-wall carbon nanotube after treatment according to embodiment 5.

DETAILED DESCRIPTIONS OF THE PREFERRED EMBODIMENTS

The invention is further described in details in combination with the embodiments as follows:

Embodiment 1

After ultrasonic dispersion for 20 min of 0.05 g single-wall carbon nanotube in 20 ml ethanol, suspension of single-wall carbon nanotube is formed. Put the suspension in an UV light washing machine to treat for 40 min. Perform ultrasonic washing of the resulting single-wall carbon nanotube powder with 20 ml mixed liquor of DNIF and TFA (9:1/Vol) for 30-60 min, and perform centrifugal separation at the rotating rate of 7000 rpm, then repeat ultrasonic washing for 5 times, and finally, perform ultrasonic dispersion with ethanol for 20 min, then centrifuge twice, to obtain the ethanol dispersion liquid of SWCNT. Refer to FIG. 1 for the dispersion condition of single-wall carbon nanotube. Its measured absorbance value is 1655.

Embodiment 2

After ultrasonic dispersion for 20 min of 0.05 g single-wall carbon nanotube in 20 m ethanol, suspension of single-wall carbon nanotube is formed. Put the suspension in an UV light washing machine to treat for 40 min to obtain the single-wall carbon nanotube powder; take 20 ml deionized water and put in an single-necked flask, and add 10 ml concentrated $HNO_3$ (68 wt %) and 5 wt % ammonium persulfate (APS) water solution, then mix them evenly, add the purified single-wall carbon nanotube powder, perform magneton stirring, and perform reflux reaction at 120° C. for 5 h. Repeat centrifugal washing with deionized water (7000 rpm, 10 min) for 3 times, and finally, perform ultrasonic dispersion of the resulting single-wall carbon nanotube with ethanol for 20 min, then centrifuge twice, to obtain the ethanol dispersion liquid of SWCNT. Refer to FIG. 1 for the dispersion condition of single-wall carbon nanotube. Its measured absorbance value is 1745.

Embodiment 3

After ultrasonic dispersion for 20 min of 0.05 g single-wall carbon nanotube in 20 ml ethanol, suspension of single-wall carbon nanotube is formed. Put the suspension in an UV light washing machine to treat for 40 min. Perform ultrasonic washing of the resulting single-wall carbon nanotube powder with 20 ml mixed liquor of DMF and TFA (9:1/Vol) for 30 min, and perform centrifugal separation, then repeat ultrasonic washing for 5 times. Then perform ultrasonic washing with ethanol for 20 min, then centrifuge twice. Finally, pour the ethanol dispersion liquid of SWCNT into a culture dish, and put in an UV light washing machine to treat for 40 min to obtain the single-wall carbon nanotube powder; take 20 ml deionized water and put in an single-necked flask, and add 10 ml concentrated $HNO_3$ (68 wt %) and 1.5 g ammonium persulfate (APS), then mix them evenly, add the purified single-wall carbon nanotube powder, perform magneton stirring, and reflux reaction at 85° C. for 5 h.

Repeat centrifugal washing with deionized water (7000 rpm, 10 min) for 3 times, and finally, perform ultrasonic dispersion of the resulting single-wall carbon nanotube with ethanol for 20 min, then centrifuge twice, to obtain the ethanol dispersion liquid of SWCNT. Refer to FIG. 1 for the dispersion condition of single-wall carbon nanotube. Its measured absorbance value is 1544.

Embodiment 4

After ultrasonic dispersion for 20 min of 0.05 g single-wall carbon nanotube in 20 ml ethanol, suspension of single-wall carbon nanotube is formed. Put the suspension in an UV light washing machine to treat for 40 min to obtain the single-wall carbon nanotube powder; take 20 ml concentrated sulfuric acid in an single-necked flask, add the purified single-wall carbon nanotube powder, perform magneton stirring, and swelling for 12 h at room temperature. Dilute the mixed concentrated sulfuric acid solution with 10:1 water, then perform centrifugal separation for 4 times. Finally, obtain the single-wall carbon nanotube powder. Put the powder in an single-necked flask, add 20 ml deionized water and then add 10 ml concentrated $HNO_3$ (68 wt %) and 1.5 g ammonium persulfate (APS), then perform magneton stirring, and reflux reaction at 85° C. for 5 h.

Repeat centrifugal washing with deionized water (7000 rpm, 10 min) for 3 times, and finally, perform ultrasonic dispersion of the resulting single-wall carbon nanotube with ethanol for 20 min, then centrifuge twice, to obtain the ethanol dispersion liquid of SWCNT. Refer to FIG. 1 for the dispersion condition of single-wall carbon nanotube. Its measured absorbance value is 1487.

Embodiment 5

After ultrasonic dispersion for 20 min of 0.05 g single-wall carbon nanotube in 20 ml ethanol, suspension of single-wall carbon nanotube is formed. Put the suspension in an UV light washing machine to treat for 40 min to obtain the single-wall carbon nanotube powder; take 20 ml concentrated sulfuric acid in an single-necked flask, add the purified single-wall carbon nanotube powder, perform magneton stirring and swelling for 12 at room temperature. Dilute the mixed concentrated sulfuric acid solution with 10:1 water, then perform centrifugal separation for 4 times. Finally, obtain the single-wall carbon nanotube powder. Put the powder in an single-necked flask, add 20 ml deionized water and then add 10 ml concentrated $HNO_3$ (68 wt %) and 10 ml $H_2O_2$, perform magneton stirring and reflux reaction at 85° C. for 5 h.

Repeat centrifugal washing with deionized water (7000 rpm, 10 min) for 3 times, and finally, perform ultrasonic dispersion of the resulting single-wall carbon nanotube with ethanol for 20 min, then centrifuge twice, to obtain the ethanol dispersion liquid of SWCNT. Refer to FIG. 1 for the dispersion condition of single-wall carbon nanotube. Its measured absorbance value is 1766.

Embodiment 6

Add 10 ml PEDOT: PSS (poly (3,4-ethylenedioxythiophene): sodium polystyrene sulfonate water solution, commercially available, containing 1.8% PEDOT) to the dispersion liquid of carbon nanotube in Embodiment 1, and after ultrasonic dispersion, obtain the carbon nanotube ink solution. Use the ink solution to prepare a transparent conductive electrode film on the surface of PET film through spin coating process, with the rate controlled at 3000 rpm 40 s.

The transmittance of the prepared transparent electrode film is over 80% at the optical wavelength of 550 nm, and the sheet resistance is 100-150Ω/□.

Add the dispersion liquid of single-wall carbon nanotube with good dispersibility prepared in the invention to a conductive polymer system as a conductive material, and under the condition of no surfactant being added, to prepare the high-performance carbon nano composite flexible transparent electrode material, with high transmittance and low sheet resistance.

The dispersion liquid of single-wall carbon nanotube with good dispersibility prepared in the invention can be used as a carrier of nano-catalyst or other functional nano materials, to achieve its application in a special environment.

What is claimed is:
1. A method for uniform dispersion of single-wall carbon nanotubes, comprising the following steps:
   (1) Dispersing single-wall carbon nanotube powder in a low-boiling point alcohol or water or DMF, then placing into a UV bench for ultraviolet irradiation and oxidation;
   (2) After cleaning the carbon nanotubes in the UV bench, using a strong acid to carry out an oxidation reaction, then washing by centrifugation to remove the strong acid; and
   (3) After cleaning with strong acid in step (2), subjecting the single-wall carbon nanotubes to ethanol or water ultrasonic dispersion 2-3 times, washing by centrifugation, then dissolving in low-boiling point alcohol or water or DMF solution to obtain a single-wall carbon nanotube dispersion.
2. The method according to claim 1, wherein the irradiation power of the UV bench is 250 W-500 W, and the irradiation must last 30-60 minutes.

3. The method according to claim 1, wherein the oxidation reaction is performed in the presence of strong oxidizing acid or mixture of strong acid and oxidizing agent.

4. The method according to claim 3, wherein the strong oxidizing acid is selected from the group consisting of concentrated nitric acid, concentrated sulfuric acid, and trifluoroacetic acid (TFA), and the mixture of strong acid and oxidizing agent is selected from the group consisting of concentrated nitric acid with peroxide, and concentrated sulfuric acid with peroxide.

5. The method according to claim 4, wherein the peroxide is selected from the group consisting of hydrogen peroxide and ammonium peroxide.

6. The method according to claim 5, wherein:
the reaction should be performed for 0.5-5 h at 80-120° C. when the strong oxidizing acid is selected from the group consisting of concentrated nitric acid and concentrated sulfuric acid or when the mixture of strong acid and oxidizing agent is selected from the group consisting of concentrated nitric acid with peroxide and concentrated sulfuric acid with peroxide; or when the strong oxidizing acid is TFA, step 2 includes ultrasonic dispersion performed for 30-120 minutes at normal temperature, and perform centrifugal washing, then perform oxidation at normal temperature repeatedly for 2-5 times.

7. The method according to claim 1, wherein the Step (1) or/and Step (2) is repeated once or twice.

8. The method according to claim 1, wherein the dispersion in Step (1) is dispersion through ultrasonic wave or cell crusher.

9. The method according to claim 1, wherein the alcohol with low boiling point is methanol or ethanol.

* * * * *